US005745796A

United States Patent [19]

Hancock

[11] Patent Number: 5,745,796
[45] Date of Patent: Apr. 28, 1998

[54] METHOD FOR COMPACTING AND STORING DATE INFORMATION BY CONVERTING ALPHANUMERIC DATA INTO BASE ELEVEN NUMBERS WHICH CONSISTS OF NUMBERS AND CHARACTERS REPRESENTATIVE OF UNKNOWN DIGITS

[75] Inventor: Daniel W. Hancock, Culver City, Calif.

[73] Assignee: Adventures in Ancestry, Inc., Culver City, Calif.

[21] Appl. No.: 418,405

[22] Filed: Apr. 7, 1995

[51] Int. Cl.$^6$ .................................. G06F 13/00
[52] U.S. Cl. ............... 395/885; 395/824; 395/894; 395/898; 341/50; 341/56; 341/76
[58] Field of Search .................. 283/2; 341/62, 341/76; 360/22; 364/400, 405, 709.16; 368/28; 382/222; 395/497.01, 824, 885, 894, 898; 434/189

[56] References Cited

U.S. PATENT DOCUMENTS

| | | | |
|---|---|---|---|
| 3,681,859 | 8/1972 | Sandoval et al. | 434/189 |
| 3,685,021 | 8/1972 | Mauch et al. | 360/22 |
| 3,689,915 | 9/1972 | De Clerck et al. | 341/76 |
| 4,276,606 | 6/1981 | Harigaya et al. | 364/709.16 |
| 4,424,567 | 1/1984 | Yasutake | 364/405 |
| 4,719,450 | 1/1988 | Yamauchi | 341/62 |
| 4,811,407 | 3/1989 | Blokker, Jr. et al. | 382/222 |
| 5,222,052 | 6/1993 | Salame | 368/28 |
| 5,247,435 | 9/1993 | Yoshikawa et al. | 364/400 |
| 5,374,083 | 12/1994 | Slocomb | 283/2 |
| 5,426,760 | 6/1995 | Moreland | 395/497.01 |

*Primary Examiner*—Thomas C. Lee
*Assistant Examiner*—Po C. Huang
*Attorney, Agent, or Firm*—Blakely, Sokoloff, Taylor & Zafman LLP

[57] ABSTRACT

A method for compacting and storing date information in multiple calendar systems. Alphanumeric data corresponding to the day, month and year are entered, including "?" characters for values or individual digits that are unknown or uncertain. The year data is converted to a base eleven number for compaction and then further converted to a binary number for storage.

4 Claims, 2 Drawing Sheets

| Year Input | Base eleven Value | Binary Value |
|---|---|---|
| 0??? | $(1000)_{11}$ | 0000000000001 |
| ⋮ | | |
| 0??9 | $(100A)_{11}$ | 0000000001010 |
| ⋮ | | |
| 0?99 | $(10AA)_{11}$ | 0000001111001 |
| ⋮ | | |
| 6065 | $(7176)_{11}$ $-(0AAA)_{11}$ $=(8191)_{10}$ | 1111111111111 |

| Year Input | Base eleven Value | Binary Value |
|---|---|---|
| 0??? | $(1000)_{11}$ | 0000000000001 |
| ⋮ | | |
| 0??9 | $(100A)_{11}$ | 0000000001010 |
| ⋮ | | |
| 0?99 | $(10AA)_{11}$ | 0000001111001 |
| ⋮ | | |
| 6065 | $(7176)_{11}$<br>$-\underline{(0AAA)_{11}}$<br>$=(8191)_{10}$ | 1111111111111 |

Figure 2

METHOD FOR COMPACTING AND STORING DATE INFORMATION BY CONVERTING ALPHANUMERIC DATA INTO BASE ELEVEN NUMBERS WHICH CONSISTS OF NUMBERS AND CHARACTERS REPRESENTATIVE OF UNKNOWN DIGITS

BACKGROUND OF THE INVENTION

FIELD OF THE INVENTION

The present invention generally relates to the field of data storage, and more particularly to a system and method for storing date information.

BACKGROUND

Researching and documenting family histories is a pastime that many find fascinating. There are a number of available systems for maintaining genealogical records. Some such systems are paper oriented with handwritten data entry. However, computer based systems have substantially greater capabilities, particularly in terms of data management functions.

Dates are obviously critical in any genealogical recording system. In a typical general purpose data processing system, a date (day, month and year) is converted to a numeric "Julian" day number. The day number is the number of days counted from a fixed base date. The advantages of this approach are that the day number (i) can be packed and stored in a small number of bytes (ii) is a sequence number so that dates can be readily sorted and sequenced, (iii) allows the number of days between two dates to be easily computed, (iv) allows the day of the week to be easily computed, and (v) logic is relatively straightforward.

However, for purposes of maintaining genealogical records, the typical Julian dating system has a number of disadvantages. First of all, it is often the case that only partial or incomplete dates can be obtained from source records. Furthermore, as a family history is traced back in time, dates may be expressed in a number of different calendar systems. A conventional Julian date recording scheme does not support dates based on a different calendar system, nor does it offer any way of recording partial or incomplete dates or the confidence level or reliability of a particular date.

Accordingly, a need exists for a date recording scheme that meets the demands of a comprehensive genealogical record keeping system, but that is also economical in terms of data storage requirements.

SUMMARY OF THE INVENTION

The present invention provides a versatile date handling scheme that is particularly adapted for use in a genealogical record keeping system. However, the invention is not limited to this particular application.

The present invention allows the input and processing of incomplete dates, confidence level information, and dates that have been recorded in various calendar systems. The invention also normalizes and compacts the dates into a very small number of bytes.

In one aspect of the invention, a method of storing date information in a memory of a data processing system is provided. The method comprises the steps of entering alphanumeric data corresponding to a date year, wherein the date year data thus entered comprises a character set corresponding to the numerals 0–9 and a character representative of an unknown digit; converting the entered alphanumeric data to a corresponding base eleven number; converting said base eleven number to a corresponding binary number; and storing said binary number in a data field within said memory.

BRIEF DESCRIPTION OF THE DRAWINGS

FIG. 2 illustrates the compaction of year data according to the present invention.

DETAILED DESCRIPTION OF THE INVENTION

Figure 1:
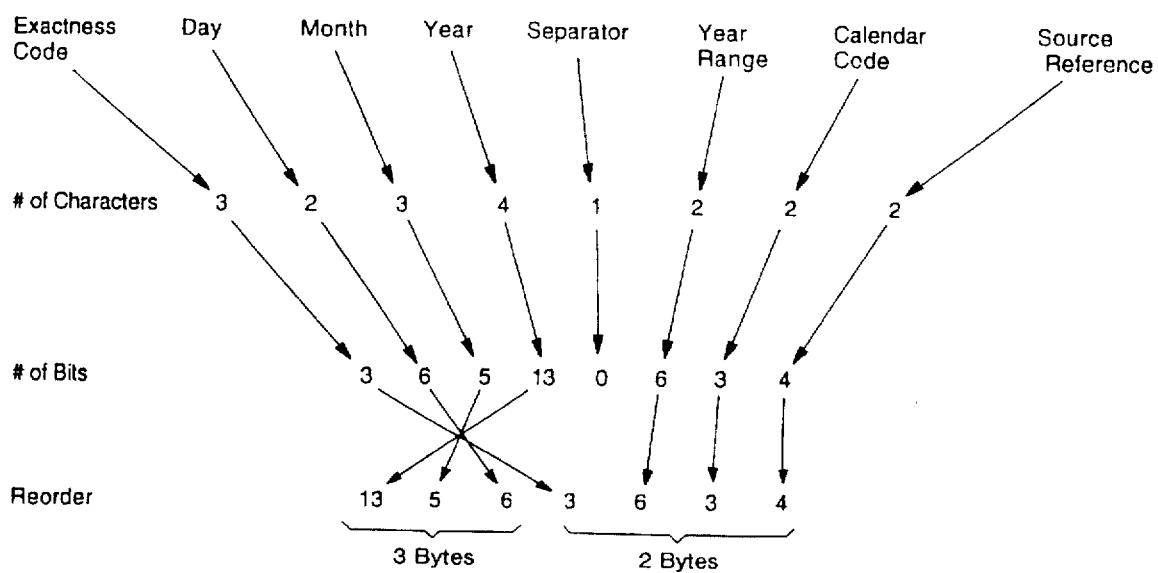
FIG. 1 illustrates the data entry fields and compaction process of the present invention.

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods are omitted so as to not obscure the description of the present invention with unnecessary detail.

The requirements for recording genealogical and historical dates are quite different from the requirements for handling dates in most data processing applications. In a typical data processing system, each date (day, month and year) is converted to a numeric "Julian" day number. Such day number is the number of days from a fixed base date. There are several advantages to this approach. First of all, since the day number is a single numeric value, it can be packed and stored in a small number of bytes. Secondly, the day numbering system allows dates to be readily sorted and sequenced by their relative numeric values. In addition, the number of days between any two dates can be easily computed. Furthermore, the day of the week is relatively easily to compute in a day numbering sequence.

The above noted advantages are significant in many data processing applications. However, the typical Julian date recording scheme has a number of disadvantages that are extremely significant in the context of genealogical and historical dating. It is quite common that only partial or incomplete dates can be determined from the various records from which genealogical and historical data are obtained. A sequential numbering scheme cannot accommodate partial or incomplete dates. Even though a date range can be specified, it is often the case that partial information does not result in uncertainty within a contiguous range of dates. For example, if only the decade digit of a year is illegible or otherwise doubtful, but the rest of the date is known, the uncertainty does not span an entire century, but instead is confined to ten specific dates within the century. Another disadvantage of a sequential numbering scheme is that all dates must be translated into a common calendar system. Dates of mixed calendar systems cannot be accommodated.

In accordance with the present invention, dates are initially entered as strings of characters in input fields that are up to 24 characters in length. Each date input field may consist of up to eight subfields. After a date has been input, it is organized and normalized into a fixed length 19 byte string consisting of eight fixed length subfields. These are used to test the date for validity. Upon finding the date to be valid, the 19 byte date is compacted into 40 bits (5 bytes) as indicated below.

Dates are entered in a day-month-year sequence with the month entered alphabetically. This avoids ambiguities arising from strictly numeric entries since it is uncertain whether the day of the month precedes the month or vice versa. In addition to the actual date (day, month and year), additional subfields relating to the date may comprise an exactness code, a year range, a calendar code and a source reference. In addition, a one character separator subfield is required between the year and year range, if one is specified. Separation characters between other subfields may be included during data entry, but are not required.

The data entry fields and compaction process are illustrated in FIG. 1. The input fields are reordered during the compaction process to place the year, month and day in the first 24 bits (3 bytes), followed by the exactness code, year range, calendar code and source reference in the next 16 bits (2 bytes). Specifications for each of the seven stored subfields are as follows:

Year:

Each year input must be four-digits long. This is because a 1-digit, 2-digit, or 3-digit year numbers may be the result of an input error and can be ambiguous. Each of the year digits, except for the first, may be replaced with a "?" to indicate that the particular digit is uncertain or unknown. The year entry is therefore converted to a base eleven number as illustrated in FIG. 2. The smallest year value is 0???, which is converted to the base eleven number $(1000)_{11}$. Accordingly, the lowest 1,330 base eleven values are not utilized, and the converted base eleven year value is reduced by $(0AAA)_{11}=(1330)_{10}$ before packing as a binary number. With 13 bits available for the packed binary year value, the maximum year value is 6065. As shown in FIG. 2, this corresponds to a base eleven year value of $(7176)_{11}$ which, after normalizing, corresponds to a decimal value of $(8191)_{10}$. Input date limits are set as follows: Gregorian and Julian years from 0001 to 2075 maximum, Jewish years from 3174 to 5836 maximum, and B.C. years may range from 6065 to 1.

Month:

Packed into 5 bits. The 32 possible values are used as follows: 12 (1-12) for Julian and Gregorian months, one (13) for an unknown month ("???"), 13 (14-26) for Jewish months, plus 5 (27-31) for the seasons of the year. The 32 values have the following specific meanings:

| | | | |
|---|---|---|---|
| 0 = no entry | 11 = Nov | 22 = Iyr | |
| 1 = Jan | 12 = Dec | 23 = Siv | |
| 2 = Feb | 13 = ??? | 24 = Tam | |
| 3 = Mar | 14 = Tis | 25 = Av | |
| 4 = Apr | 15 = Hes | 26 = Elu | |
| 5 = May | 16 = Kis | 27 = Sum | (Summer) |
| 6 = Jun | 17 = Teb | 28 = Aut | (Autumn) |
| 7 = Jul | 18 = She | 29 = Fal | (Fall) |
| 8 = Aug | 19 = Ad1 | 30 = Win | (Winter) |
| 9 = Sep | 20 = Ad2 | 31 = Spr | (Spring) |
| 10 = Oct | 21 = Nis | | |

Day:

Packed into 6 bits. This allows 64 maximum values, 58 of which are used as follows: 0 to 31 for day numbers, 15 for question mark combinations, and 11 for LDS (Mormon) codes. The values above 31 have the following specific meanings:

| | | |
|---|---|---|
| 32 = 3? | 41 = ?4 | 50 = Child |
| 33 = 2? | 42 = ?5 | 51 = Cleared |
| 34 = 1? | 43 = ?6 | 52 = Completed |
| 35 = ? | 44 = ?7 | 53 = Infant |
| 36 = ?? | 45 = ?8 | 54 = Stillborn |
| 37 = ?0 | 46 = ?9 | 55 = Submitted |
| 38 = ?1 | 47 = BIC | 56 = Uncleared |
| 39 = ?2 | 48 = Canceled | 57 = See Notes |
| 40 = ?3 | 49 = DNS/CAN | |

Exactness Code:

Packed into 3 bits. The eight possible values have the following specific meanings:

| | |
|---|---|
| 0 = no entry | 5 = Family reported |
| 1 = After | 6 = Calculated |
| 2 = Before | 7 = Living |
| 3 = Circa (or About, Abt, or Estimated) | |
| 4 = Exact | |

Year Range:

Packed into 6 bits. This allows a double dating range of 63 years maximum. "Double dating" refers to the ambiguity that arises due to the change from the Julian or "Old Style" calendar to the Gregorian or "New Style" calendar. Double dates were frequently used by early historical recorders to specify a date under both the New and Old Style calendar systems. The year range value is added to the normal year to create the upper year of a range of years. Normally, the value here is zero.

Calendar Code:

Packed into 3 bits. The eight possible values have the following specific meanings:

| | Input Codes Allowed |
|---|---|
| 0 = no entry | NS or New or Gre |
| 1 = New Style/Gregorian | OS or Old or Jul |
| 2 = Old Style/Julian | JH or Jew or Heb |
| 3 = Jewish/Hebrew | DD or Dou |
| 4 = Double Dating OS/NS | FR or Fre |
| 5 = French Republican | BC or Bef |
| 6 = BC Calendar | ?? |
| 7 = Unknown | |

Source Reference:

Packed into 4 bits. 15 source reference values are possible.

Since a group of ancestry dates may be a heterogeneous mix of dates under various calendar systems, they may actually be overlapping dates and are not in a format appropriate for date sorting. To sort a series of heterogeneous dates in chronological sequence, it is necessary to first build a sort array wherein all dates have been converted to a Gregorian/New Style standard.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

To assist in a fuller understanding of the invention described herein, the following are BASIC language source listings for subroutines that pack a 19-character date into 5 bytes and that convert a 4-byte year string to a base eleven value.

| DEFINT A–Z |
| --- |
| Pack a 19-Character Date into Five Bytes |

```
FUNCTION DataPackTo5bytes$ (DateIn$) STATIC
    'Local variables: byte2, byte3, byte4, byte5, DayNo, MonNo
    'Local variables: ExaCd, CalNo, Range, SouNo, Yr11
                'Convert aaaddmmmmyyyy/rrccss date
                'input string to a YMDQQ string
    ExaCd = INSTR(",,AftBefCirExaFamCalLivBicCanDnsChiCleComInfStiSubUncSee", LE
FT$(DateIn$, 3)) \ 3
    IF ExaCd > 7 THEN           'i.e., if a Mormon code, then
        DayNo = ExaCd + 39          'only the DayNo field is used
        ExaCd = 0: MonNo = 0: Yr11 = 0: Range = 0: CalNo = 0: SouNo = 0
    ELSE
        DayNo = VAL(MID$(DateIn$, 4, 2))
        MonNo = INSTR(",,   JanFebMarAprMayJunJulAugSepOctNovDec???TisHesKisTebSh
eAd1Ad2NisIyrSivTamAv EluSumAutFalWinSpr", MID$(DateIn$, 6, 3)) \ 3 - 1
        FourBytes$ = MID$(DateIn$, 9, 4): ComputeBase11Val FourBytes$, Yr11
        Range = VAL(MID$(DateIn$, 14, 2))
        CalNo = INSTR(", NSOSJHDDFRBC??", MID$(DateIn$, 16, 2)) \ 2
        SouNo = VAL(MID$(DateIn$, 18, 2))
    END IF      '/ pack the 2nd thru 5th bytes of the 5-byte output string
    byte2 = (Yr11 MOD 32) * 8 + MonNo \ 4
    byte3 = (MonNo MOD 4) * 64 + DayNo
    byte4 = (ExaCd MOD 8) * 32 + (CalNo MOD 8) * 4 + Range \ 16
    byte5 = (Range MOD 16) * 16 + SouNo
    DatePackTo5bytes$ = CHR$(Yr11 \ 32) + CHR$(byte2) + CHR$(byte3) + CHR$(byte4) +
CHR$(byte5)
END FUNCTION
```

| Convert a 4-Byte String to a Base 11 Value |
| --- |

```
SUB ComputeBase11Val (FourBytes$, Yr11) STATIC
    'Local variables: QC, Val1, Zc
    'Local variables: FourBytes$         Output variable: Yr11
    Yr11 = 0
    FOR Zc = 1 TO 4                  'This is used for years and times
        Qc = ASC(MID$(FourBytes$, Zc, 1))
        IF Qc = 32 OR Qc = 63 THEN Val1 = 0 ELSE Val1 = Qc - 47
        Yr11 = Yr11 * 11 + Val1
    NEXT
    IF Yr11 THEN Yr11 = Yr11 - 1330    'The lower 1,330 values aren't used
END SUB
```

What is claimed is:

1. A method for compacting and storing date information in a memory of a data processing system comprising the steps of:

entering alphanumeric data corresponding to a date year, wherein the date year data thus entered comprises a character set corresponding to the numerals 0–9 and a character representative of an unknown digit;

converting the entered alphanumeric data to a corresponding base eleven number;

converting said base eleven number to a corresponding binary number for compaction; and storing said compacted binary number in a data field withing said memory.

2. The method of claim 1 further comprising the step of entering data corresponding to a day of month, wherein the day of month data thus entered comprises a character set corresponding to the numerals 0–9 and a character representative of an unknown digit.

3. The method of claim 1 further comprising the step of entering data corresponding to a date month, wherein the date month data thus entered is selected from a data set that includes data representative of an unknown month.

4. The method of claim 3 wherein the date year and date month are expressed in one of a plurality of calendar systems and further comprising the step of entering data identifying said one of a plurality of calendar systems.

\* \* \* \* \*

UNITED STATES PATENT AND TRADEMARK OFFICE
CERTIFICATE OF CORRECTION

PATENT NO. : 5,745,796
DATED : April 28, 1998
INVENTOR(S) : Hancock

It is certified that error appears in the above-identified patent and that said Letters Patent is hereby corrected as shown below:

Column 5,
Line 53, please delete "data field withing said memory" and insert -- data field within said memory --.

Signed and Sealed this

Twenty-first Day of June, 2005

JON W. DUDAS
*Director of the United States Patent and Trademark Office*